United States Patent [19]
Kim

[11] Patent Number: 5,675,170
[45] Date of Patent: Oct. 7, 1997

[54] DATA OUTPUT BUFFER

[75] Inventor: Pil Jong Kim, Sungnam-shi, Rep. of Korea

[73] Assignee: Hyundai Electronics Industries, Co., Ltd., Kyungki-Do, Rep. of Korea

[21] Appl. No.: 476,597

[22] Filed: Jun. 7, 1995

[30] Foreign Application Priority Data

Jun. 15, 1994 [KR] Rep. of Korea .................. 94-13500

[51] Int. Cl.$^6$ ..................................... H01L 29/76
[52] U.S. Cl. .................. 257/373; 257/371; 257/494
[58] Field of Search ................................. 257/373, 371, 257/494, 372, 357, 376, 358

[56] References Cited

U.S. PATENT DOCUMENTS 4,922,317  5/1990  Mihara ........................... 257/372
5,216,294  6/1993  Ryu .
5,293,060  3/1994  Komori et al. .................. 257/372
5,406,513  4/1995  Canaris et al. ................. 257/373
5,416,351  5/1995  Ito et al. ...................... 257/357

Primary Examiner—Carl W. Whitehead, Jr.
Assistant Examiner—Courtney A. Bowers
Attorney, Agent, or Firm—Fish & Richardson, P.C.

[57] ABSTRACT

A data output buffer is disclosed. Generation of a latch-up is prevented by forming a N-well guard ring to interrupt the movement of minority carriers injected from the drain of NMOS transistor to the N$^+$ pickup region of PMOS transistor. Accordingly, reliability of the device is improved.

1 Claim, 2 Drawing Sheets

DATA OUTPUT BUFFER

BACKGROUND OF INVENTION

1. Field of the Invention

The present invention relates to a data output buffer, and particularly to a data output buffer which can prevent generation of a latch=up by forming a N-well guard ring so that minority carriers injected from the drain of a NMOS transistor are not reached at a $N^+$ pickup region of a PMOS transistor.

2. Information Disclosure Statement

In general, a data output buffer utilizes a CMOS transistor having a NMOS transistor and a PMOS transistor. If minority carriers injected from the drain of the NMOS transistor are moved to a $N^+$ pickup region for supplying a bias voltage to the N-well in which a PMOS transistor is formed and the number of minority carriers reaching the $N^+$ pickup region of N-well is increased, a bipolar transistor which exists parasitically is turned on, thereby generating a latch-up.

A data output buffer composed of a conventional CMOS transistor is described with reference to FIGS. 1 and 2.

FIG. 1 is a lay-out of a data output buffer and FIG. 2 is a cross sectional view taken along with a line X—X' of FIG. 1.

A p-well 2 and a N-well 3 are formed in a p-type substrate 1, respectively, with the P-well 2 isolating from the N-well 3. A NMOS transistor is formed in the p-well 2, and a PMOS transistor is formed in the N-well 3. A first N-well guard ring 4A is formed around the p-well 2, and a second N-well guard ring 4B is formed around the N-well 3. The NMOS transistor is composed of a gate electrode 21, and a first and second $N^+$ regions 22 and 23 connected to a source and a drain electrode, respectively. The first $N^+$ region 22 is connected to a grounded voltage source Vss, and the second $N^+$ region 23 is connected to a data input and output pad(Data I/O pad) 5. The PMOS transistor is composed of a gate electrode 31, and a first and second $P^+$ regions 32 and 33 connected to a source and a drain electrode, respectively. A first $N^+$ pickup region 34 for supplying a bias voltage Vcc to the N-well 3 is formed adjacent the second $P^+$ region 33. The first $P^+$ region 32 is connected to the data input and output pad 5, and the bias voltage Vcc is supplied to the second $P^+$ region 33 and the first $N^+$ pickup region 34. A second and a third $N^+$ pickup region 41A and 41B for supplying the bias voltage Vcc are formed in the first and second N-well guard rings 4A and 4B, respectively, and the bias voltage Vcc is supplied to the second and third $N^+$ pickup regions 41A and 41B. In the drawings, reference number 6 and 7 denote an insulation layer and a metal line, respectively.

At the time of operation of the data output buffer having the above described structure, the minority carriers moved along paths A1 and A2 and injected from the second $N^+$ region 23, that is, a drain of the NMOS transistor, are captured to the first and the second N-well guard ring 4A and 4B. Some of the minority carriers moved along paths A1 and A2 and may be move to the first $N^+$ pickup region 34 of the N-well 3.

If the minority carriers moved along paths A3 and A4 injected from the second $N^+$ region 23 are not completely captured to the first and the second N-well guard ring 4A and 4B and move to the first $N^+$ pickup region 34 for supplying the bias voltage to the N-well 3 in which the PMOS transistor is formed, the bipolar transistor which exists parasitically is turned on, thereby generating a latch-up. Accordingly, the reliability of the device is decreased.

SUMMARY OF THE INVENTION

An object of the present invention is to provide a data output buffer which can improve the reliability of the device by effectively preventing a latch-up caused by a movement of minority carriers injected from a NMOS transistor to a $N^+$ pickup region for supplying the bias voltage to a N-well of PMOS transistor.

To achieve such object, a data output buffer of the present invention is characterized by a N-well guard ring for interrupting the movement of the minority carriers is formed widely between a p-well and a N-well on a substrate.

BRIEF DESCRIPTION OF THE DRAWINGS

For a fuller understanding of the nature and the objective of the invention, reference should be made to the following detailed description in conjunction with the accompanying drawings in which.

DETAILED DESCRIPTION OF THE INVENTION

Figure 3:
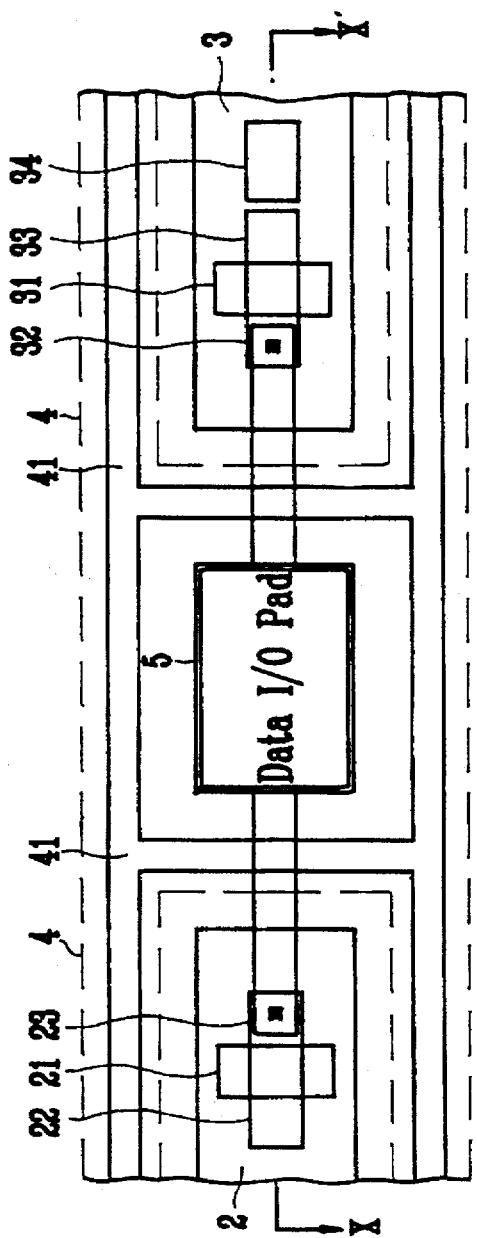
FIG. 3 is a lay-out of a data output buffer according to the present invention.
Figure 4:
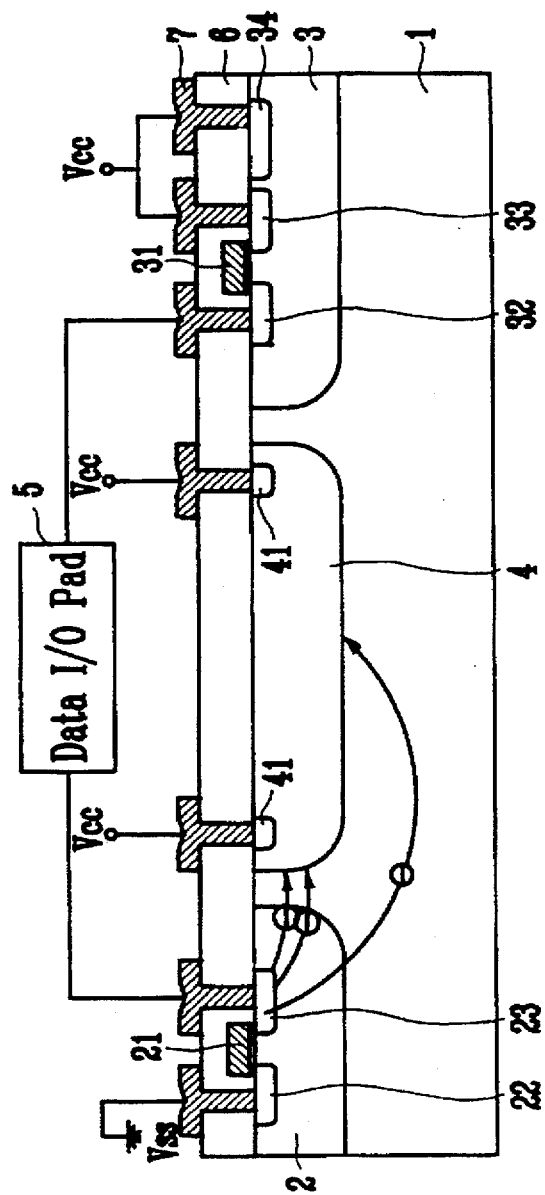
FIG. 4 is a cross sectional view taken along with a line X—X' of FIG. 3.

FIG. 3 is a lay-out of a data output buffer according to the present invention and FIG. 4 is a cross sectional view taken along with a line X—X' of FIG. 3.

A data output buffer of the present invention consists of: a NMOS transistor having one terminal which is connected to a grounded voltage source Vss and the other terminal which is connected to a data input and output pad; a PMOS transistor having one terminal which is connected to a bias voltage source Vcc and the other terminal which is connected to the data input and output pad; and a N-well guard ring formed between the NMOS transistor and the PMOS transistor to interrupt the movement of the minority carriers.

The most important part of the data output buffer of the present invention is the N-well guard ring for interrupting the movement of the minority carriers. Therefore, the present invention is described in detail concentrating on the N-well guard ring, and the description of the other parts will be omitted by quoting the description with reference to FIGS. 1 and 2.

As shown in FIGS. 3 and 4, in the data output buffer according to the present invention, the N-well guard ring 4 is disposed under a data input and output pad 5. The N-well guard ring 4 is not only formed on a portion adjacent to the P-well 2 and the N-well 3, but also formed on a portion of the P-type substrate under the data output pad 5, wherein the guard ring 4 is formed as a single ring. Therefore, the region of it is extended.

Figure 1:
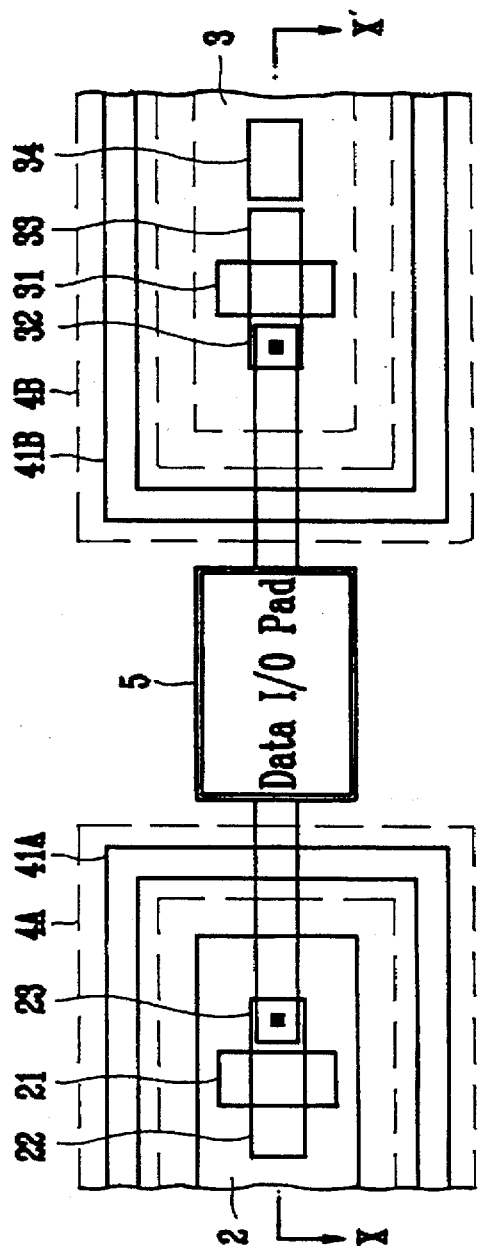
FIG. 1 is a lay-out of a data output buffer according to conventional technology.
Figure 2:
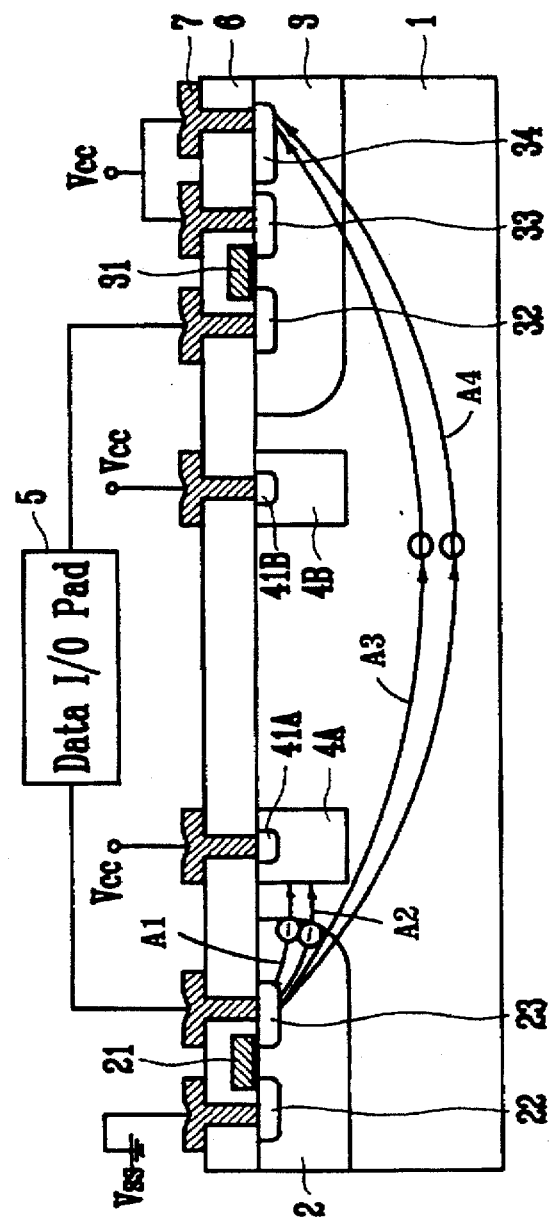
FIG. 2 is a cross sectional view taken along with a line X—X' of FIG. 1.

That is, the N-well guard ring 4 does not have a separated structure such as the first and the second N-well guard ring 4A and 4B as shown in FIGS. 1 and 2 but has a widely expanded and integrated structure. Accordingly, the minority carriers transmitted from the second $N^+$ region 23 to the first $N^+$ pickup region 34 of the PMOS transistor are completely captured to the N-well guard ring 4, thereby preventing generation of the latch-up.

In addition, in the conventional data output buffer, the second and the third $N^+$ pickup regions 41A and 41B supplying the bias voltage Vcc are formed in the first and second N-well guard rings 4A and 4B, respectively. However, in the present invention, the N-well guard ring 4 is formed as single ring, and a $N^+$ pickup region 41 supplying the bias voltage Vcc is formed along the inner side of the N-well guard ring 4.

As described above, according to the present invention, the N-well guard ring is formed widely between the P-well and the N-well and is segregated a prescribed distance from the P-well and the N-well, so that the minority carriers transmitted from the drain of NMOS transistor to the $N^+$ pickup region of PMOS transistor are completely captured to the N-well guard ring, thereby preventing generation of the latch-up; and accordingly, the reliability of the device is improved.

Although this invention has been described in its preferred embodiment with a certain degree of particularity, one skilled in the art would know that the preferred embodiment disclosed here is only an example and that the construction, combination and arrangement of its parts may be varied without departing from the spirit and scope of the invention.

What is claimed is:

1. A data output buffer comprising:

a P-type substrate having a P-well and a N-well formed relative to each other on said substrate;

a NMOS transistor formed in said P-well of said P-type substrate, said NMOS transistor having first and second $N^+$ regions connected to a first source electrode and a first drain electrode, respectively, and a first gate electrode;

a PMOS transistor formed in said N-well of said P-type substrate, said PMOS transistor having first and second $P^+$ regions connected to a second source electrode and a second drain electrode, respectively, and a second gate electrode;

a data input and output pad connected to said second $N^+$ region of said NMOS transistor and to said first $P^+$ region of said PMOS transistor; and a N-well guard ring continuously formed in said P-type substrate at locations Under said data input and output pad and surrounding said P-well and N-well.

* * * * *